(12) United States Patent
Wesström

(10) Patent No.: US 7,910,384 B2
(45) Date of Patent: Mar. 22, 2011

(54) METHOD FOR PRODUCING A MODULATED GRATING FOR AN OPTIMAL REFLECTION SPECTRUM

(75) Inventor: Jan-Olof Wesström, Stockholm (SE)

(73) Assignee: Syntune AB, Kista (SE)

( * ) Notice: Subject to any disclaimer, the term of this patent is extended or adjusted under 35 U.S.C. 154(b) by 244 days.

(21) Appl. No.: 12/064,092

(22) PCT Filed: Aug. 16, 2006

(86) PCT No.: PCT/SE2006/050283
§ 371 (c)(1),
(2), (4) Date: Sep. 20, 2008

(87) PCT Pub. No.: WO2007/021241
PCT Pub. Date: Feb. 22, 2007

(65) Prior Publication Data
US 2009/0170229 A1 Jul. 2, 2009

(30) Foreign Application Priority Data
Aug. 17, 2005 (SE) ...................................... 0501823

(51) Int. Cl.
*H01L 21/00* (2006.01)

(52) U.S. Cl. ................................. 438/7; 438/29; 438/32
(58) Field of Classification Search .............. 438/29–32, 438/34–35, 7
See application file for complete search history.

(56) References Cited

U.S. PATENT DOCUMENTS
| 7,083,995 B2 * | 8/2006 | Sakata ........................... 438/32 |
| 2004/0001671 A1 | 1/2004 | Liu et al. |
| 2005/0018964 A1 | 1/2005 | Chen |

FOREIGN PATENT DOCUMENTS
| EP | 0847116 | 6/1998 |
| WO | WO 0054080 | 9/2000 |
| WO | WO 03010586 | 2/2003 |

* cited by examiner

*Primary Examiner* — Richard A. Booth
(74) *Attorney, Agent, or Firm* — Young & Thompson

(57) ABSTRACT

Method for producing a modulated grating for an optimal reflection spectrum, which grating is a multiple wavelength reflector. The method includes the following steps: a) Determining wavelengths to be reflected b) Calculating a preliminary grating c) Comparing the reflection spectrum $r^o(f)$ with the characteristics of the wanted modulated grating d) Differences lead to a directional change of $r^o(f)$ e) Calculating a target function $G(z)$ f) Changing the grating ($z_k$) depending on the real and imaginary part of $G(z)$ g) Repeating steps c) to f) until the grating reflects the predetermined wavelengths.

7 Claims, 5 Drawing Sheets

METHOD FOR PRODUCING A MODULATED GRATING FOR AN OPTIMAL REFLECTION SPECTRUM

The present invention concerns a method for producing a modulated grating for a reflection spectrum.

The present invention concerns a method for producing distributed reflectors for lasers.

Tuneable semiconductor lasers have several different sections through which current is injected. It is typical that the lasers have three or four sections. The wavelength of the lasers, their power and their modal purity can be controlled by adjusting the current in the different sections. Modal purity describes the situation in which the laser is to operate, i.e. in a combination of the three or four injected drive currents, that is characterised by the laser being in a condition far from a combination of the drive currents where what are known as "mode jumps" take place, such that the lasering is stable and side modes are largely suppressed.

Different applications have specific requirements for the control of the wavelength. It is one requirement for applications within telecommunication that the laser maintain its wavelength with very high precision and for a very long time once the drive current and the temperature have been adjusted. The precision required is typically 0.1 nanometer and the duration required is typically 20 years.

The distributed Bragg reflector (DBR) has had a major influence on the development of modern semiconductor lasers. A narrow band of wavelengths can be selected with the aid of the DBR, and this means that a single longitudinal oscillation mode can be caused to dominate the emission strongly, which in turn means that the spectral width of the laser light will be very small. A multiple wavelength reflector can be created if a DBR is modified. One freely chosen wavelength of these wavelengths can be selected with a spectral selection mechanism, and this forms the basis of a very highly tuneable laser. There are many reasons for using tuneable lasers in, for example, wavelength-multiplexed optical networks, including that of using such a laser as a back-up for a number of other lasers with fixed wavelengths. The telecommunication market places severe demands on components that are part of equipment. A tuneable laser must for this reason constitute a comparable alternative to a laser with a fixed wavelength. The reflector is a very important part of the laser, and increased reflectivity here has a major significance for the performance of the component.

There is a need in photonic applications for waveguides with gratings that provide a reflection spectrum with a correct form. There is, for example, a need to have an essentially uniform reflection level across a broad spectral region, such as for example the complete C-band, which stretches from 191.2-196.2 THz. Another example is that there is a need for a multi-peaked spectrum with a series of narrow reflection peaks.

The calculations required to design a reflection grating that it is possible to produce and that has a specified reflection spectrum are both extensive and difficult. Several suggestions have therefore been suggested in which various tricks have been used to reduce the burden of the calculations. Restrictions on the design of the grating are introduced at the same time as the burden of calculations is reduced.

According to a first known method, the grating is limited such that it is superperiodic. One section of grating having, for example, 200 rulings is freely designed. The grating section is subsequently repeated several times in order to produce a grating spectrum having the shape of a comb. i.e. a grating spectrum with a number of high reflection peaks. The inverse of the length of the repeated grating section gives the spectral separation of the reflection peaks. This method is practical, in that it reduces the calculation work required to design the short sections of grating.

The method is, however, not optimal for a number of reasons. A first reason is that it can produce only reflection spectra with equal distances between the reflection peaks. A second reason is that there is a certain minimum resolution involved in the process of ruling the grating with the use of electron beam lithography. A third reason is that a strictly superperiodic grating always demonstrates lower peaks around each spectral peak due to the grating having an abrupt start and an abrupt ending.

According to a second known method, the grating is calculated with a function:
$f(z)=sum_j(Aj\ sin(Psi_j+2*pi\ z/Lambda_j))$, where $Lambda_j$ are the wavelengths at which it is desired to obtain reflection peaks, Aj and $Psi_j$ are free parameters that can be varied in order to improve the reflection spectrum, and z is the position along the grating. The function describes a grating that, should it be converted into a variation in refractive index along the grating, would create an ideal spectrum with reflections at frequencies that correspond to the Bragg periods $Lambda_j$. Since it is practical in a real grating to create only two levels of refractive index, corresponding to etched or not-etched regions, the grating is etched when $f(z)<0$, in order to follow f(z) as closely as possible. This is a rather simple method for creating a grating, but it is not optimal.

The first non-optimal feature is that the method produces a grating with a ruling width that varies. This is very difficult to achieve with electron beam lithography. The second non-optimal feature is that the number of parameters to optimise is only 2*Npeaks ($A_j$, $Psi_j$), where Npeaks is the number of reflection peaks. There is, for this reason, limited scope for an optimal solution that is close to the desired spectrum. The third non-optimal feature is that the grating has approximately the same strength along the complete length of the grating, and this reduces its flexibility.

According to a similar, third, known method, a design function f(z) is used to simplify the calculations, with the introduction of several limitations into the design of the grating. An algorithm based on f(z) is available that suggests immediately a position of the grating rulings. F(z) is varied through the parameters (Aj, $Psi_j$) until a satisfactory spectrum is obtained. The method has a number of limitations, as have the other methods. One first limitation is that the number of parameters to optimise is only 2*Npeaks ($A_j$, $Psi_j$). There is, for this reason, a limited scope to search for an optimal solution that is close to the desired grating.

It is usually the case that the amplitude of a reflection is more important than the phase of the reflection, although it is desired in the case of, for example, an MGY laser to control also the phase of the reflections. This requires further degrees of freedom. It is for this reason desirable that the position of each ruling in the grating can be individually controlled in order to optimise the grating. A typical grating contains approximately 2,000 rulings, and for this reason the optimisation of a target function describing these rulings is very difficult, even if considerable computing power is used.

The present invention solves this problem through the use of a method that comprises several degrees of freedom.

The present invention thus offers a method for producing gratings, which method involves the imposition of few restrictions on the gratings, while at the same time being computationally efficient.

The present invention thus relates to a method for producing a modulated grating for an optimal reflection spectrum, which grating is a multiple wavelength reflector, which grating is provided with regions in the grating material that lie transverse to the longitudinal axis of the grating, in which regions the refractive index is higher or lower than it is in the surrounding part of the grating and where the separation between neighbouring regions is varied, and it is characterised in that the method comprises the following steps:

a) a number of wavelengths that are to be reflected or an interval of wavelengths that is to be reflected is determined, b) a preliminary grating that has a reflection spectrum $r^0(f)$, which satisfies at least to some extent the reflections specified in step a), is calculated with a suitable known calculation method, c) the reflection spectrum $r^0(f)$ is compared with the characteristics that the modulated grating is to have, d) on the condition that step c) has revealed differences, the reflection spectrum $r^0(f)$ is caused to be changed in a direction by $\Delta r(f)$, e) a target function $G(z)$ is calculated not only for the position $z_k$ of each ruling of the grating, but also for each position at which sufficient space is available to create a grating ruling, where the target function $G(z)$ is an integral between the influence of the reflection spectrum $\delta r(f, z)$ for one grating ruling and the change $\Delta r(f)$, f) the grating ($z_k$) is caused to be changed, depending on the values of the target function $G(z)$ with respect to its real part and its imaginary part, by carrying out one or several of the modifications: to add one or several rulings where space is available, to remove one or several rulings, and/or to move one or several rulings, g) the steps c) to f) are repeated until the target function specifies that the grating reflects the wavelengths as specified in step a).

The invention is described in more detail below, partially with reference to the attached drawings where:

Figure 4:
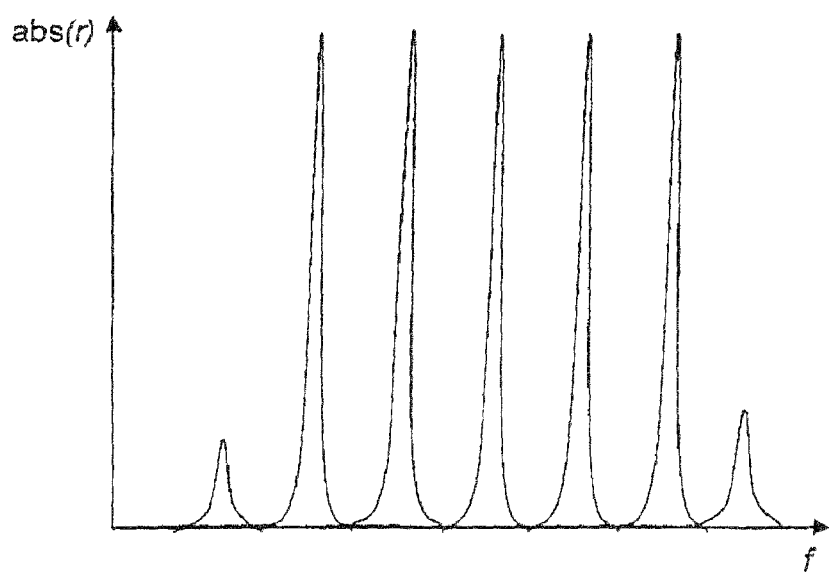
Figure 5:
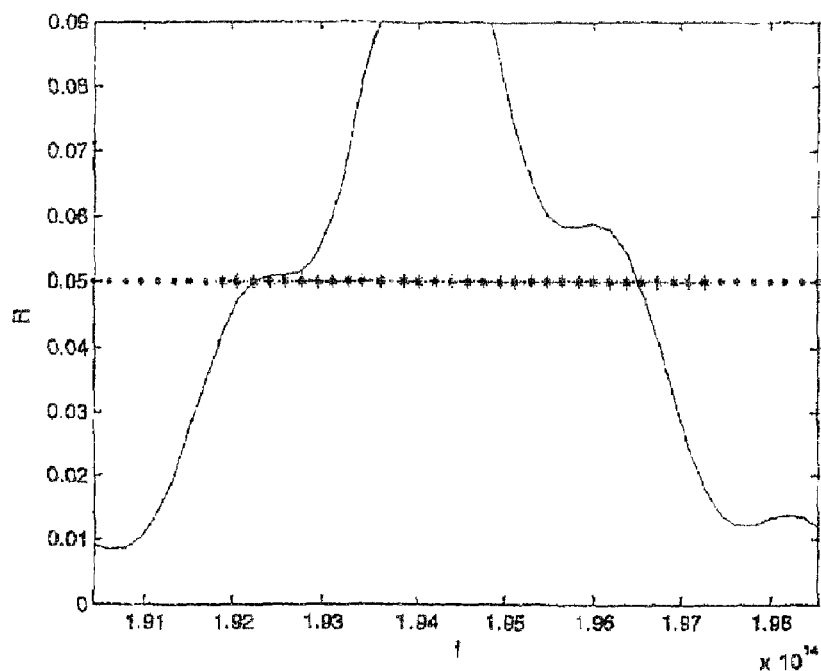
Figure 6:
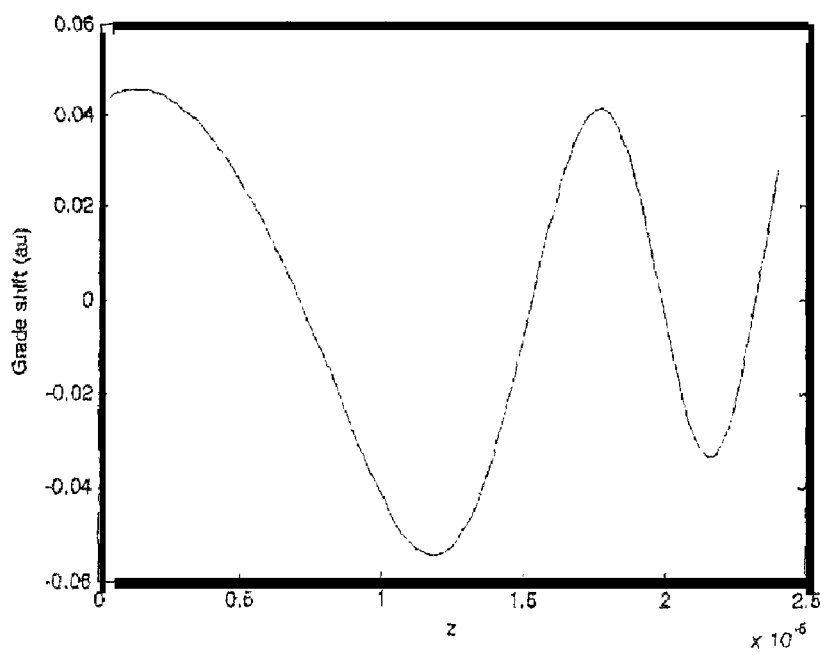
Figure 7:
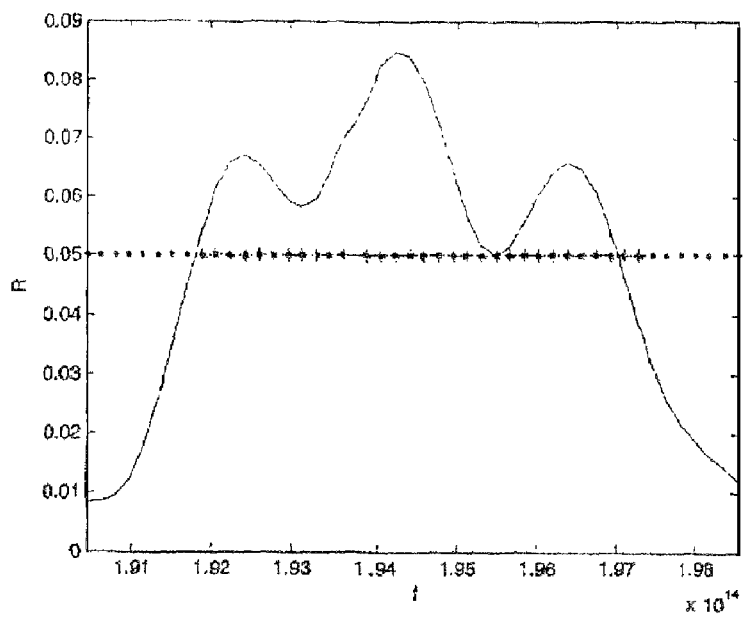
Figure 8:
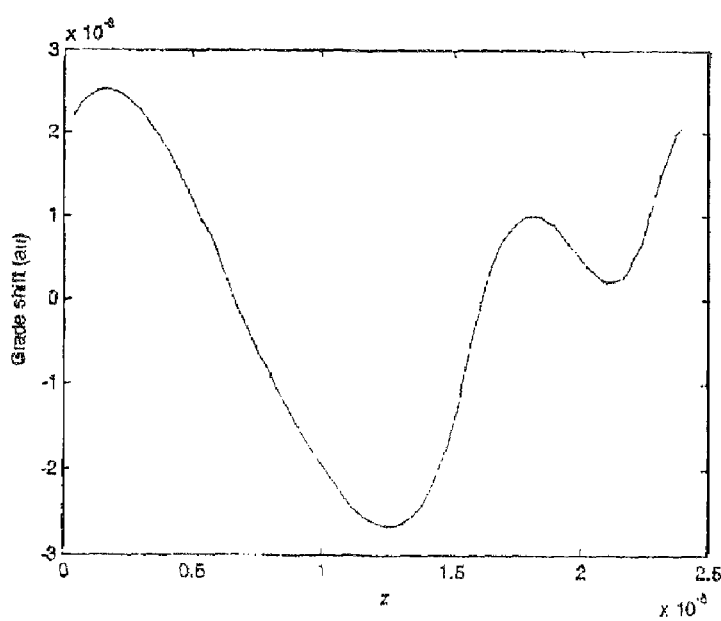
Figure 9:
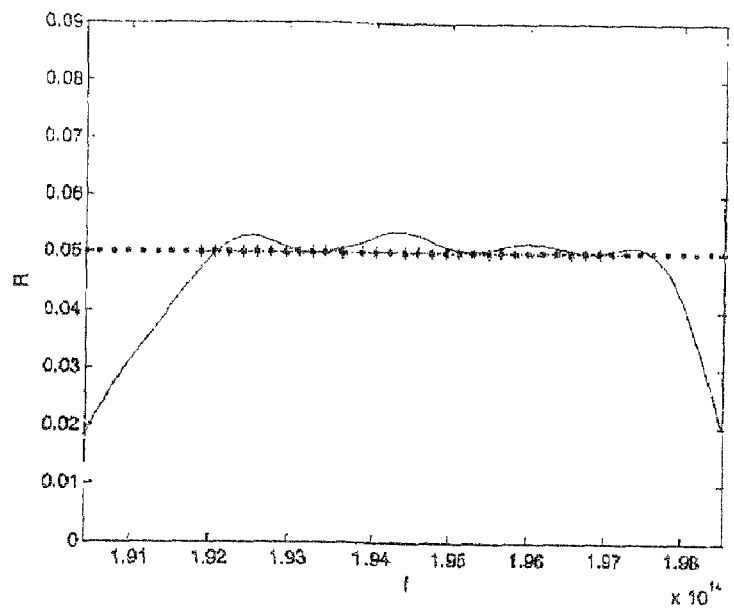
Figure 10:
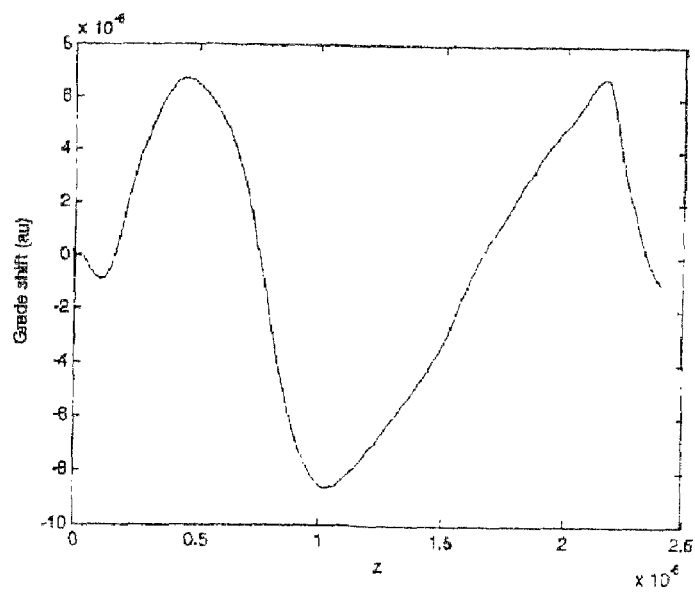

FIG. 4 shows a desired reflection spectrum for a number of determined frequencies, FIG. 5 shows an example of a reflection spectrum, FIG. 6 shows an example of the imaginary part of a target function, FIG. 7 shows an example of a reflection spectrum after three iterative calculations, FIG. 8 shows an example of the target function after three iterative calculations, FIG. 9 shows an example of a reflection spectrum after 20 iterative calculations, FIG. 10 shows an example of the target function after 20 iterative calculations.

Figure 1:
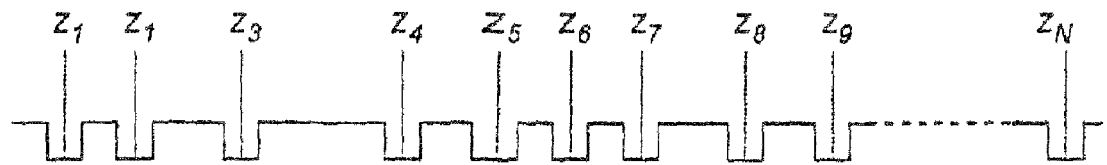
FIG. 1 shows a longitudinal section of a grating.
Figure 2:
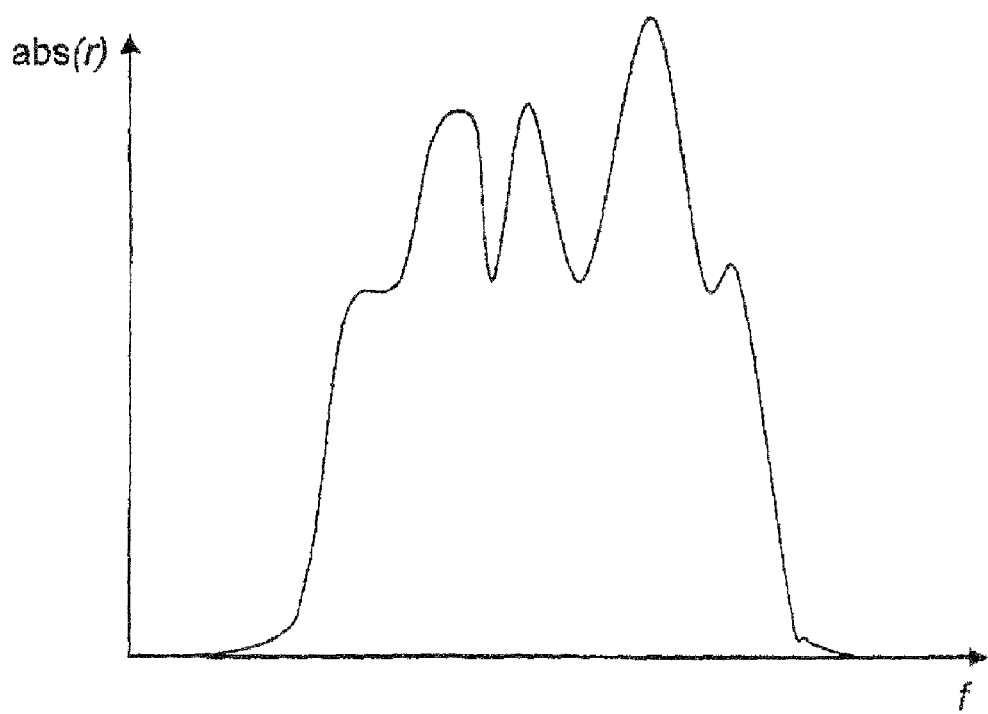
FIG. 2 shows a reflection spectrum.
Figure 3:
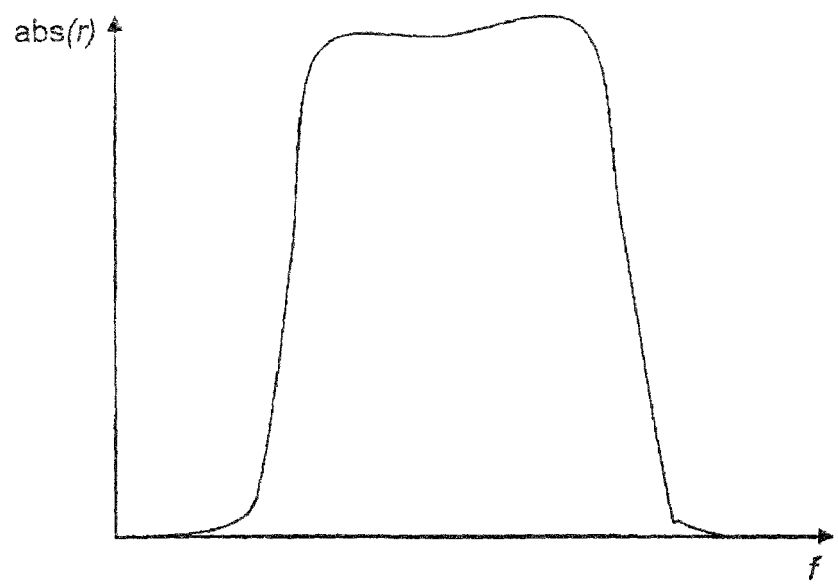
FIG. 3 shows an example of a desired reflection spectrum for the C-band.

The present method of calculating a grating is to calculate a general grating by optimising the number of grating rulings and the position of each ruling individually in order to optimise the target function. This is the same as the process of optimising the vector $z_k$ in FIG. 1. A reflection spectrum is first calculated and then the target function is formed with which the said reflection spectrum is compared with a desired reflection spectrum. The target function gives a high value for a reflection spectrum that lies close to the desired spectrum and a low value for a reflection spectrum that lies far from the desired spectrum. The target function is then optimised with respect to the positions of the rulings of the grating using standard mathematical methods.

This takes place, according to the invention, in a number of steps, where step a) comprises the determination of a number of wavelengths that are to be reflected or an interval of wavelengths that is to be reflected.

A preliminary grating, which has a reflection spectrum $r^0(f)$ that fulfils at least partially the reflections specified in step a) is calculated in step b) using a suitable known calculation method.

The reflection spectrum $r^0(f)$ is compared in step c) with the characteristics that the modulated grating is to have.

On the condition that step c) has revealed differences, the reflection spectrum $r^0(f)$ is caused to be changed in step d) by $\Delta r(f)$.

A target function $G(z)$ is calculated in step e) not only for the position $z_k$ of each ruling of the grating, but also for each position at which sufficient space is available to create a grating ruling. The target function $G(z)$ is an integral between the influence of the reflection spectrum $\delta r(f, z)$ for one grating ruling and the change $\Delta r(f)$.

The grating ($z_k$) is caused to be changed in step f), depending on the values of the target function $G(z)$ with respect to its real part and its imaginary part, by carrying out one or several of the modifications: to add one or several rulings where space is available, to remove one or several rulings, and/or to move one or several rulings, the steps c) to f) are repeated until the target function specifies that the grating reflects the wavelengths as specified in step a).

A grating ruling is caused to be added in the case in which the real part $Re[G(z)]$ of the target function is positive.

A grating ruling is caused to be removed in the case in which the real part $Re[G(z)]$ of the target function is negative.

Furthermore, the imaginary part of the target function is caused to control a change of the positions ($z_k$) of the grating rulings.

The use of the imaginary part of the target function is described below.

A position z that gives a value of the target function whose real part is greater than zero improves the grating. The effect of changing the position of a ruling from z to z+dz can be regarded as that of removing a ruling at the position z and adding a ruling at the position the z+dz. In order to determine the magnitude of the improvement that is obtained by the movement of the ruling at position z to the position z+dz, a new target function can be derived:

$$G_{shift}(z) = \frac{G(z+dz) - G(z)}{dz} =$$

$$= \frac{1}{dz}\int_{f_1}^{f_2} \Delta r*(f) \cdot r_{one}(f) \cdot (e^{2i\beta z + dz} - e^{2i\beta z})df$$

$$\approx 2i\beta_0 \int_{f_1}^{f_2} \Delta r*(f) \cdot r_{one}(f) \cdot e^{2i\beta z} df =$$

$$= 2i\beta_0 G(z)$$

$r_{one}(f)$ is the reflection obtained with one grating ruling at z=0. i is the imaginary unit. $\beta$ is the propagation factor at a frequency f. $\beta_0$ is the average propagation factor across the interval of frequencies in question.

This means that the target function for a change of the position has a positive real part when the target function for the addition of a ruling has a negative imaginary part. This means that the imaginary part of $G(z)$ can be used to determine whether it is advantageous to move a ruling or not.

The use of a matrix method for highly reflective gratings is described below.

Multiple reflection becomes important in a grating when the reflectivity is high, i.e. greater than 10%. In this case, the reflection spectrum given by a certain ruling at $z_k$ can no longer be written as:

$$\delta r(f, z) = r_{one}(f) \cdot e^{2i\beta z}$$

The matrix method can be used instead in order to calculate this contribution. (Reference: Coldren, "Diode Lasers and Photonic Integrated Circuits").

The matrix method is used to represent a grating with a series of matrices corresponding to the rulings of the grating and the delay between the rulings.

A delay function (a uniform part of the waveguide without any etched rulings) is represented by the matrix:

$$T_{delay}(L) = \begin{pmatrix} \exp(i\beta L) & 0 \\ 0 & \exp(-i\beta L) \end{pmatrix}$$

where beta may be complex in the case in which losses arise.

The reflection of a grating ruling can be represented through:

$$T_{groove} = \frac{1}{t_{one}(\beta)} \begin{pmatrix} 1 & -r_{one}(\beta) \\ r_{one}(\beta) & 1 \end{pmatrix}$$

where $r_{one}$(beta) is the reflection of one grating ruling given in terms of normalised amplitudes, and:

$$t_{one}(\beta) = \sqrt{1 - |r_{one}(\beta)|^2}$$

The complete grating is then represented by the product matrix:

$$T_{grating} = \prod_k T_{delay}(z_k - z_{k-1}) \cdot T_{groove}$$

The product is calculated across all rulings k of the grating.

The composite reflection can be calculated from the matrix elements 11 and 21 in $T_{grating}$ after the matrix multiplication has been carried out:

$$r_{grating} = T_{grating21} / T_{grating11}$$

The contribution from an individual grating ruling at $z_k$ can in this way be calculated by repeating the calculation for $T_{grating}$ and $r_{grating}$ while omitting $z_k$ during the second calculation and subsequently calculating the difference.

$$\delta r_k(\text{beta}) = r_{grating} - r_{grating\_without\_groove\_at\_zk}$$

where $\delta r_k(f, z) = r_{grating}(f) - r_{grating2}(f)$,
where $r_{grating}(f)$ is the reflection spectrum for the complete grating and $r_{grating2}(f)$ is the reflection spectrum for the grating from which the ruling at z has been omitted.

This value can be calculated in the step e) in the algorithm for calculating the target function.

The case can be described as an example in which it is desired to produce a grating having a broad bandwidth and having a uniform level of reflection of $|r^2|=5\%$ across a certain interval of frequencies. In this case, a solution with, for example, 100 grating rulings is initially constructed. This first guess gives a reflection $R=|r^2|$, calculated using the matrix method and illustrated in FIG. 5. The target function G(z) is calculated and its imaginary part $G_{shift}(z)$ is shown in FIG. 6. Each grating ruling is moved in the next step as specified by the value of $G_{shift}(z)$ at each position. The grating ruling is moved in a positive z direction where the value of $G_{shift}(z)$ is positive, and the grating ruling is moved in a negative z direction where the value of $G_{shift}(z)$ is negative.

The calculations of the reflection spectrum take place iteratively. The value of the reflection spectrum after three iterations is shown in FIG. 7 and the value of $G_{shift}(z)$ after three iterations is shown in FIG. 8. The situation after 20 iterations is shown in FIGS. 9 and 10.

It is possible to change the target function specified above without deviating from the innovative concept of the invention. It is, furthermore, possible to vary the action that is to be taken on the grating depending on the values of the target function.

The present invention, therefore, is not to be regarded as being limited to the embodiments specified above since it can be varied within the scope specified by the attached patent claims.

The invention claimed is:

1. A method for producing a multiple wavelength reflector having a modulated grating for a desired reflection spectrum, comprising:
   a) determining a number of wavelengths that are to be reflected or an interval of wavelengths that is to be reflected by the reflector,
   b) calculating a preliminary grating with plural rulings that has a preliminary reflection spectrum $r°(f)$,
   c) comparing the preliminary reflection spectrum $r°(f)$ of the preliminary grating with the desired reflection spectrum,
   d) when step c) reveals a difference between the reflection spectrum $r°(f)$ and the desired reflection spectrum, then changing the reflection spectrum $r°(f)$ in a direction by $\Delta r(f)$,
   e) calculating a target function G(z) for a position $z_k$ of each ruling of the grating, and also for each position at which sufficient space is available to create an additional ruling, where the target function G(z) is an integral between the influence of the reflection spectrum $\delta r(f, z)$ for one grating ruling and the change $\Delta r(f)$,
   f) changing the rulings of the grating, depending on the values of the target function G(z) with respect to the target function's real part and the target function's imaginary part, by carrying out one or more of the following modifications:
      (i) adding one or several rulings to the grating where sufficient space is available,
      (ii) removing one or several rulings from the grating, and
      (iii) moving the position of one or several rulings of the grating, and
   g) repeating the steps c) to f) until the target function specifies that the grating reflects the number of wavelengths or the interval of wavelengths as specified in step a) to determine the number of rulings and the position of each ruling,
   h) etching the rulings determined in step g) in a grating material to produce the multiple wavelength reflector, wherein the rulings lie transverse to the longitudinal axis of the grating and each ruling has a refractive index that is higher or lower than an adjacent ruling.

2. The method according to claim 1, wherein the real part of the target function controls the adding and the removing of the rulings of the grating, and the imaginary part of the target function controls the moving the position of the rulings of the grating.

3. The method according to claim 2, wherein, in step f) a ruling is added to the grading when the real part of the target function is positive.

4. The method according to claim 2, wherein, in step f) a ruling is removed from the grading when the real part of the target function is negative.

5. The method according to claim 2, wherein, in step f) the imaginary part of the target function controls the moving the position of the rulings of the grating.

6. The method according to claim 3, wherein, in step f) the imaginary part of the target function controls the moving the position of the rulings of the grating.

7. The method according to claim 4, wherein, in step f) the imaginary part of the target function controls the moving the position of the rulings of the grating.

* * * * *